United States Patent
Yeh et al.

(10) Patent No.: US 8,921,177 B2
(45) Date of Patent: Dec. 30, 2014

(54) METHOD OF FABRICATING AN INTEGRATED CIRCUIT DEVICE

(75) Inventors: Ming-Hsi Yeh, Hsinchu (TW);
Hsien-Hsin Lin, Hsinchu (TW);
Ying-Hsueh Chang Chien, New Taipei (TW); Yi-Fang Pai, Hsinchu (TW);
Chi-Ming Yang, Hsian-San District (TW); Chin-Hsiang Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 280 days.

(21) Appl. No.: 13/189,108

(22) Filed: Jul. 22, 2011

(65) Prior Publication Data

US 2013/0023094 A1   Jan. 24, 2013

(51) Int. Cl.
*H01L 21/8238* (2006.01)
*H01L 21/20* (2006.01)

(52) U.S. Cl.
CPC ..... *H01L 21/823814* (2013.01); *H01L 21/823864* (2013.01); *H01L 21/823807* (2013.01); *Y10S 438/976* (2013.01)
USPC ........... 438/218; 438/199; 438/481; 438/745; 438/976; 257/E21.632; 257/E27.108

(58) Field of Classification Search
USPC .......... 438/199, 218, 481, 745, 976
See application file for complete search history.

(56) References Cited

U.S. PATENT DOCUMENTS

| | | | |
|---|---|---|---|
| 5,094,983 A * | 3/1992 | Furthaler et al. | 438/17 |
| 2006/0252191 A1* | 11/2006 | Kammler et al. | 438/197 |
| 2009/0218633 A1* | 9/2009 | Hoentschel et al. | 257/369 |
| 2011/0195548 A1* | 8/2011 | Yeh et al. | 438/199 |
| 2012/0315733 A1* | 12/2012 | Huang et al. | 438/199 |

* cited by examiner

*Primary Examiner* — Michelle Mandala
(74) *Attorney, Agent, or Firm* — Lowe Hauptman & Ham, LLP

(57) ABSTRACT

A method for fabricating an integrated device is disclosed. A protective layer is formed over a gate structure when forming epitaxial (epi) features adjacent to another gate structure uncovered by the protective layer. The protective layer is thereafter removed after forming the epitaxial (epi) features. The disclosed method provides an improved method for removing the protective layer without substantial defects resulting. In an embodiment, the improved formation method is achieved by providing a protector over an oxide-base material, and then removing the protective layer using a chemical comprising hydrofluoric acid.

7 Claims, 15 Drawing Sheets

METHOD OF FABRICATING AN INTEGRATED CIRCUIT DEVICE

BACKGROUND

The present disclosure relates generally to an integrated circuit (IC) device and, more particularly, to a method for forming a complementary metal oxide semiconductor (CMOS) structure.

As technology nodes shrink, in some IC designs, there has been a desire to incorporate strained engineering, including a SiGe, a SiC, a SiP and/or a Si epitaxial (epi) process, in the formation process of CMOS devices to overcome Moore's law.

There are challenges to implementing such epi features and processes in CMOS fabrication. As technology nodes continue to decrease in size, particularly to the 22 nanometer (nm) technology node and below, the defect issue is one of the key challenges for forming the epi film. The defects may result from a removal process for removing a protective layer after the formation of epi lightly doped source/drain (LDD) features and/or epi source/drain (S/D) features. The defects which result in the CMOS device may impact the yield of device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
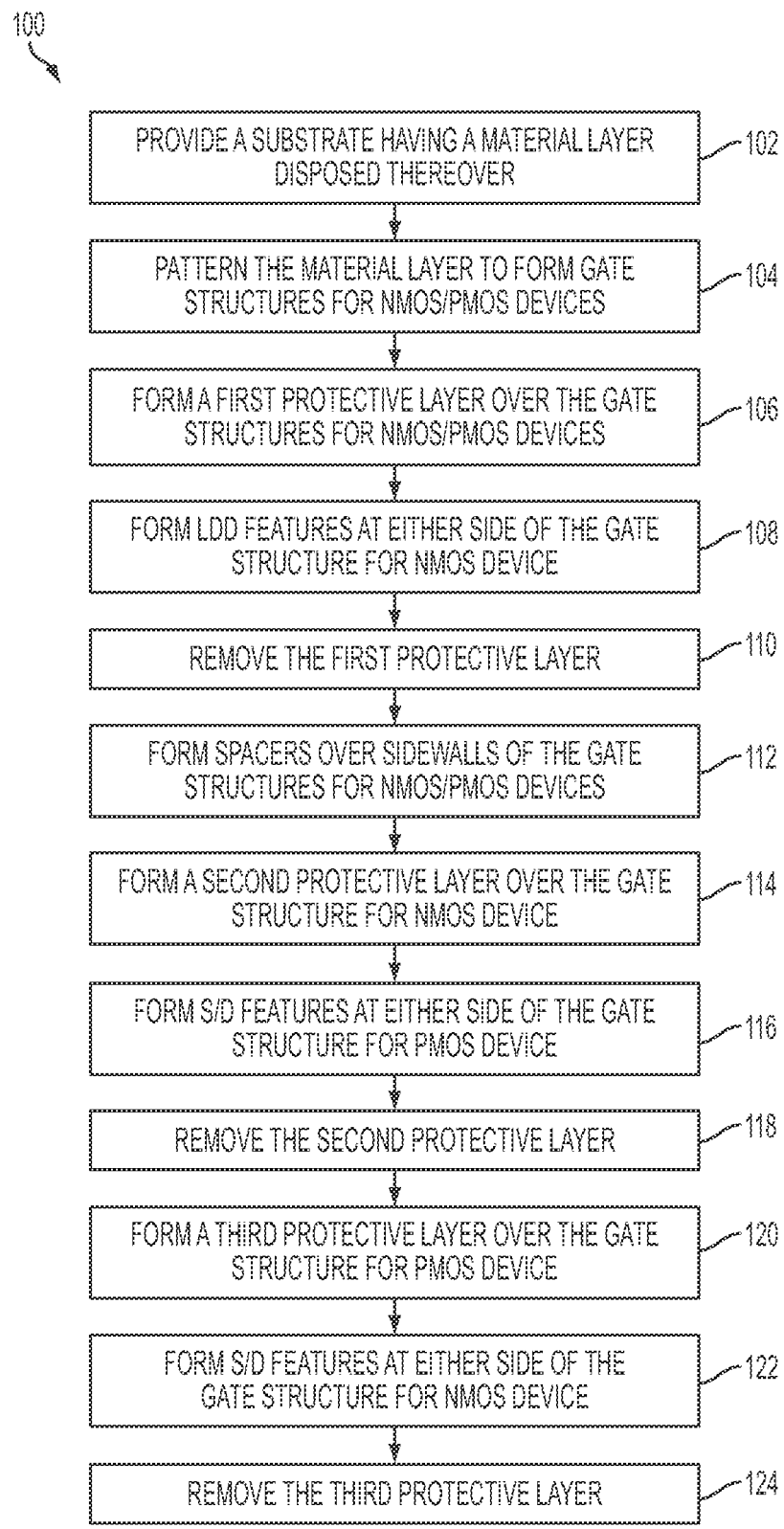
FIG. 1 is a flow chart of a method for fabricating an integrated circuit device according to aspects of the present disclosure.

The present disclosure relates generally to manufacturing integrated circuit devices and, more particularly, to protective layers used during the manufacturing processes for the integrated circuit devices.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-15, a method 100 and a semiconductor device 200 are collectively described below. The semiconductor device 200 illustrates an integrated circuit, or a portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after methods disclosed, and some of the steps described below can be replaced or eliminated, for additional embodiments of the method. It is further understood that additional features can be added in the semiconductor devices disclosed, and some of the features described below can be replaced or eliminated, to disclose additional embodiments.

Figure 2:
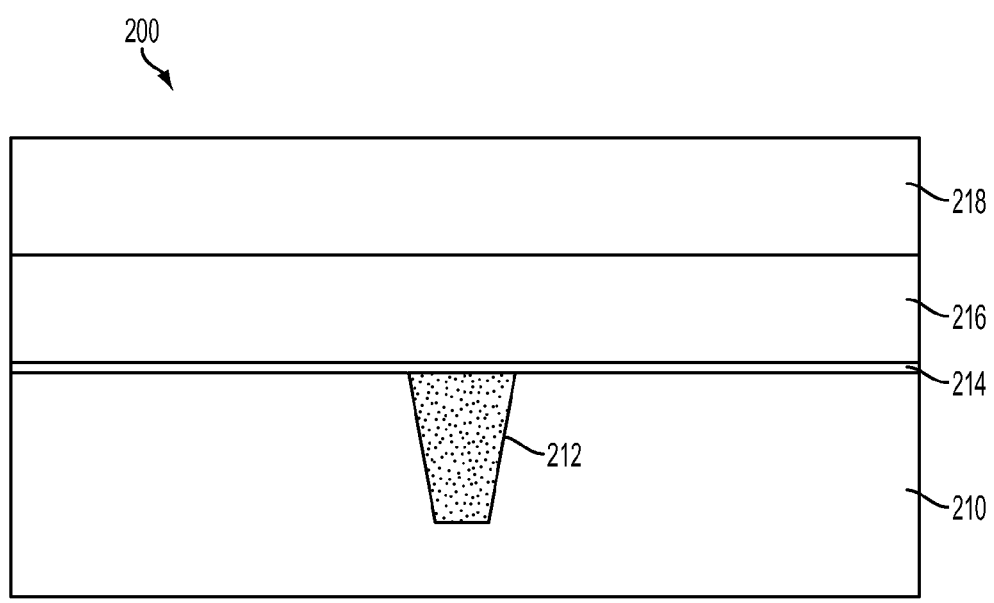
FIGS. 2-15 are various cross-sectional views of embodiments of an integrated circuit device during various fabrication stages according to the method of FIG. 1.

Referring to FIGS. 1 and 2, the method 100 begins at step 102 wherein a substrate 210 is provided. In the depicted embodiment, the substrate 210 is a semiconductor substrate including silicon. The substrate 210 may be a p-type or n-type substrate. Alternatively, the substrate 210 comprises another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS, NFET, and/or PFET technology processing, and thus some processes are not described in detail herein.

An exemplary isolation feature 212 is formed in the substrate 210 to isolate various regions of the substrate 210, and in the present embodiment, to isolate the NMOS and PMOS device regions. The isolation feature 212 also isolates the device regions from other devices (not shown). The isolation feature 212 utilizes isolation technology, such as local oxidation of silicon (LOCOS) and/or shallow trench isolation (STI), to define and electrically isolate the various regions. In the present embodiment, the isolation feature 212 includes an STI. The isolation feature 212 comprises silicon oxide, silicon nitride, silicon oxynitride, other suitable materials, or combinations thereof. The isolation feature 212 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure, such as a thermal oxide liner layer filled with silicon nitride or silicon oxide.

A material layer is formed over the substrate. The material layer includes one or more material layers comprising any suitable material and thickness. The material layer can include interfacial layers, capping layers, diffusion/barrier layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), low-pressure CVD (LPCVD), plasma enhanced CVD (PECVD), plating, other suitable methods, and/or combinations thereof. The semiconductor device 200 may include one or more antireflective coating layers, such as a top antireflective coating layer and/or a bottom antireflective coating layer.

In one embodiment, the material layer includes a gate dielectric layer 214, a gate electrode layer 216, and a hard mask layer 218. The gate dielectric layer 214 is formed over the substrate 210 by any suitable process to any suitable thickness. The gate dielectric layer 214 includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. The gate dielectric layer 214 may include a multilayer structure. For example, the gate dielectric layer 214 may include an interfacial layer, and a high-k dielectric material layer formed on the interfacial layer. An exemplary interfacial layer may be a grown silicon oxide layer formed by a thermal process or ALD process.

The gate electrode layer 216 is formed over the gate dielectric layer 214 by any suitable process to any suitable thickness. In the present embodiment, the gate electrode layer 216 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode layer 216 could include a conductive layer having a proper work function; therefore, the gate electrode layer 216 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrode layer 216 may include other conductive materials, such as aluminum, copper, tungsten, metal alloys, metal silicide, other suitable materials, or combinations thereof. For example, where the gate electrode layer 216 includes a work function layer, another conductive layer can be formed over the work function layer.

The hard mask layer 218 is formed over the gate electrode layer 216 by any suitable process to any suitable thickness. The hard mask layer 218, in one embodiment, includes silicon oxide. The hard mask layer 218, in another embodiment, may include silicon nitride (SiN), silicon oxynitride (SiON), silicon carbide (SiC), SiOC, spin-on glass (SOG), a low-k material, tetraethylorthosilicate (TEOS), plasma enhanced CVD oxide (PE-oxide), high-aspect-ratio-process (HARP) formed oxide, amorphous carbon material, other suitable materials, and/or combinations thereof. The silicon oxide layer may be formed using methods such as CVD, PVD, or ALD and may have a thickness ranging from about 300 Angstroms to about 800 Angstroms.

Figure 3:
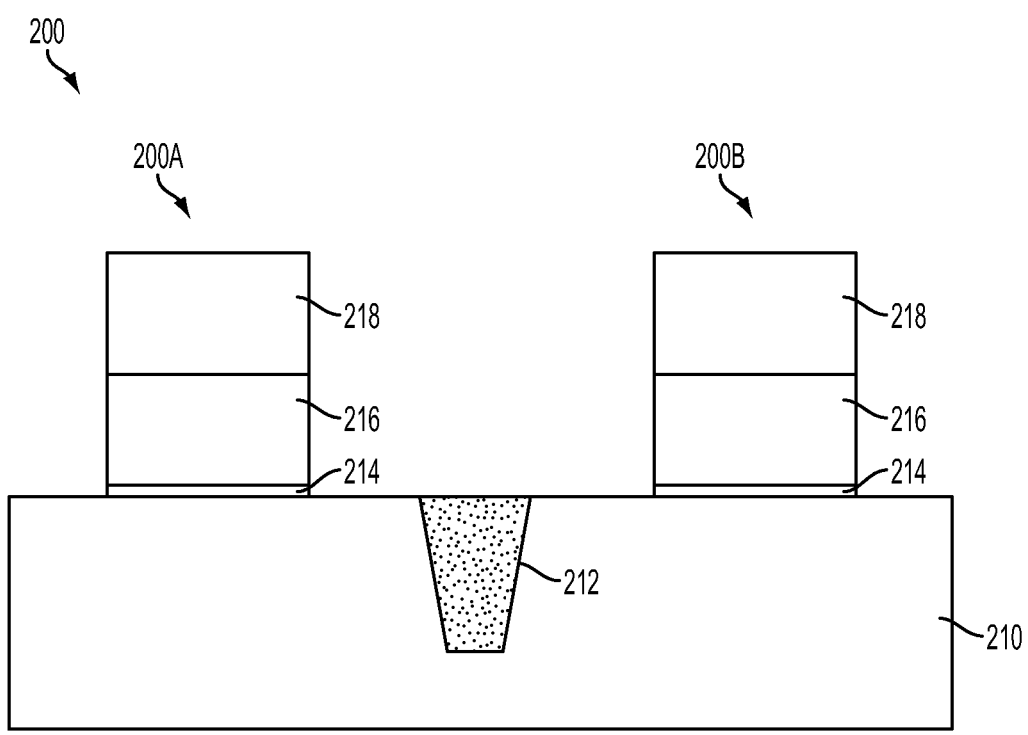

Referring to FIGS. 1 and 3, the method 100 proceeds to step 104 in which a patterning process is applied to the hard mask layer 218, the gate electrode layer 216, and the gate dielectric layer 214 to form a gate structure for a PMOS device 200A and a gate structure for a NMOS device 200B. Each gate structure comprises, in order, a gate dielectric 214, a gate electrode 216, and a hard mask 218. The patterning process, for example, includes forming a layer of photoresist (not shown) over the hard mask layer 218 by a suitable process, such as spin-on coating, and then exposing and developing the layer of photoresist to form a photoresist feature. Then, pattern of the photoresist feature can be transferred to the underlying gate dielectric layer 214, the gate electrode layer 216, and the hard mask layer 218 to form the gate structures by a dry etching process. Additionally, an antireflective coating (ARC) layer (not shown) may be formed on the hard mask layer 218 and under the layer of photoresist to enhance a subsequent patterning process. The photoresist feature may be stripped thereafter. It is understood that the above examples do not limit the processing steps that may be utilized to form the gate structures.

Figure 4:
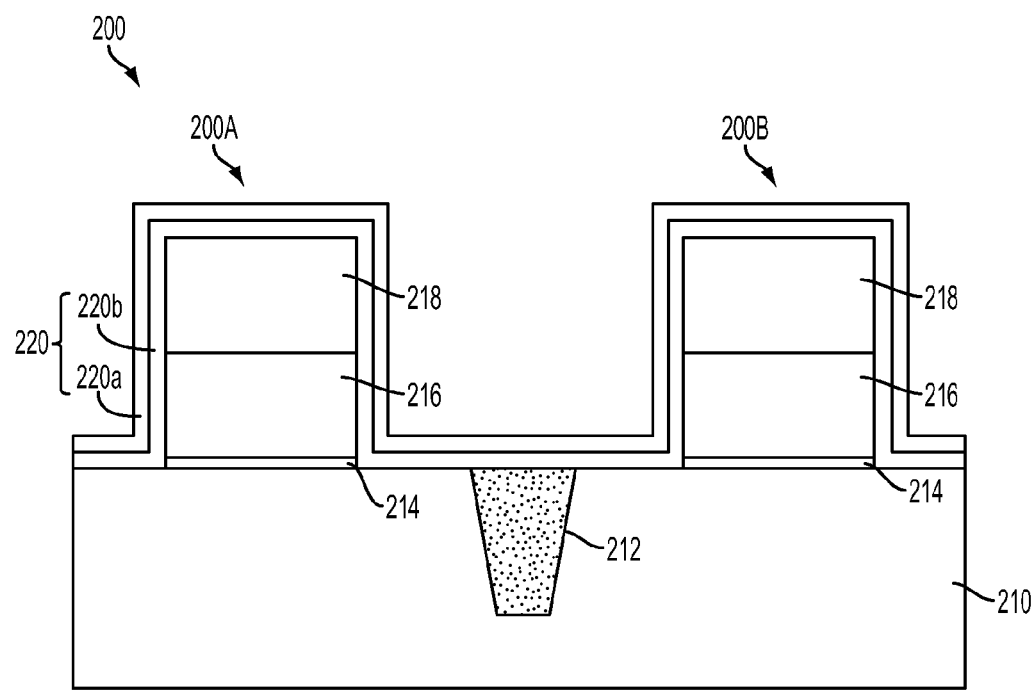

Referring to FIGS. 1 and 4, the method 100 proceeds to step 106 in which a first protective layer 220 is formed over the substrate 210, the gate structures of the PMOS device 200A and the NMOS 200B. The first protective layer 220 may comprise a top protective layer 220a and a bottom protective layer 220b. The top protective layer 220a may function as a protector to prevent or decrease epi, polycrystalline, or amorphous film from being formed thereon during a subsequent epi growth process. The bottom protective layer 220b may function as a buffer layer to provide an etching selectivity between the top protective layer 220a and the hard mask 218.

In some embodiments, the top protective layer 220a is a nitrogen-containing and silicon-containing layer. In the present embodiment, the top protective layer 220a is silicon nitride. The top protective layer 220a may be formed by a process comprising an LPCVD process, a PECVD process, an ALD process, or combinations thereof. In the depicted embodiment, the top protective layer 220a has a thickness ranging between about 50 Angstroms and about 500 Angstroms. In some embodiments, the bottom protective layer 220b includes a material different from the top protective layer 220a or the hard mask 218. The bottom protective layer 220b, for example, is silicon oxide and/or oxynitride, formed by LPCVD, PECVD, ALD, or the like. The bottom protective layer 220b has a thickness ranging between about 10 Angstroms and about 100 Angstroms.

Figure 5:
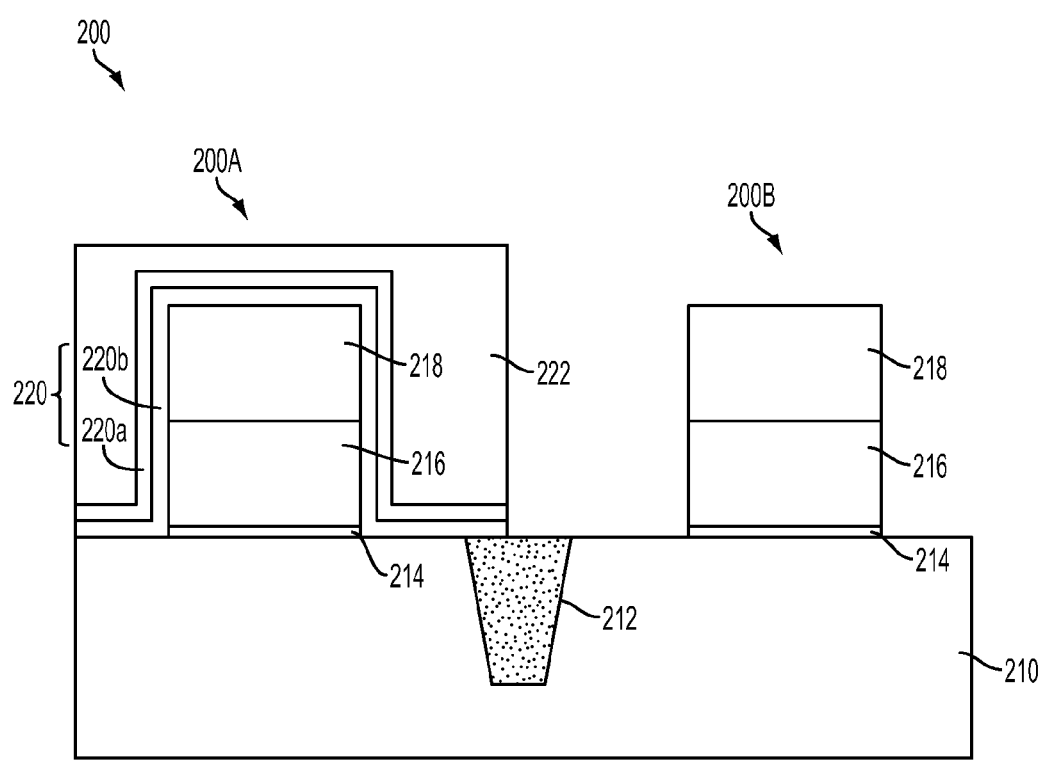

Referring to FIG. 5, the portion of first protective layer 220 which is over the NMOS device 200B is removed by a removing process to expose the substrate 210 around the gate structure of NMOS device 200B. The removing process, for example, is an etching process. In some embodiments, the etching process is a two-step dry etching process, including a first step for removing a portion of the top protective layer 220a and a second step for removing an underlying portion of the bottom protective layer 220b. The first step of etching, for example, is performed using an etching gas of $Cl_2$, HBr, $CH_2F_2$, $CHF_3$, $CF_4$, or combinations thereof. The second step of etching, for example, is performed using an etching gas of $CH_2F_2$, $CHF_3$, $CF_4$, or combinations thereof. Meanwhile, another portion of the first protective layer 220 which is over the PMOS device 200A is not removed by the etching process because of a protector 222 thereon. The protector 222, for example, is a photoresist pattern. In some embodiments, the protector 222 is removed by a stripping process after removing the first protective layer 220 over the NMOS device 200B.

Figure 6:
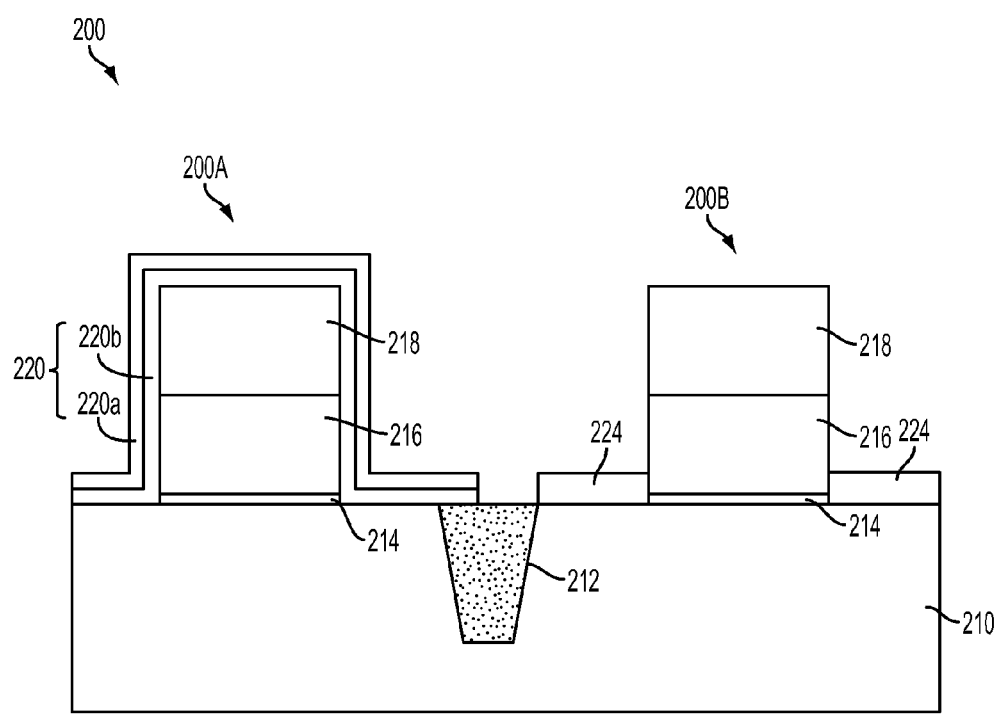

Referring to FIGS. 1 and 6, the method 100 proceeds to step 108 in which lightly doped source/drain (LDD) features 224 are formed in the NMOS device 200B. In the depicted embodiment, the LDD features 224 are adjacent to the gate structure for the NMOS device 200B. In the depicted embodiment, the LDD features 224 are on the substrate 210 referred as raised epi features with a top surface higher than the surface of the substrate 210. In one embodiment, the LDD features 224 include a semiconductor material that is the same as the substrate 210. In another embodiment, the LDD features 224 include silicon (Si). In the depicted embodiment, the LDD features 224 are formed by an epi growth process. The epi growth process may include a selective epitaxial growth (SEG) process, CVD deposition techniques (e.g., vapor-phase epitaxy (VPE) and/or ultra-high vacuum CVD (UHV-CVD)), molecular beam epitaxy (MBE), other suitable epi processes, or combinations thereof. The epi process may use gaseous and/or liquid precursors, which may interact with the composition of the substrate 210.

Figure 7:
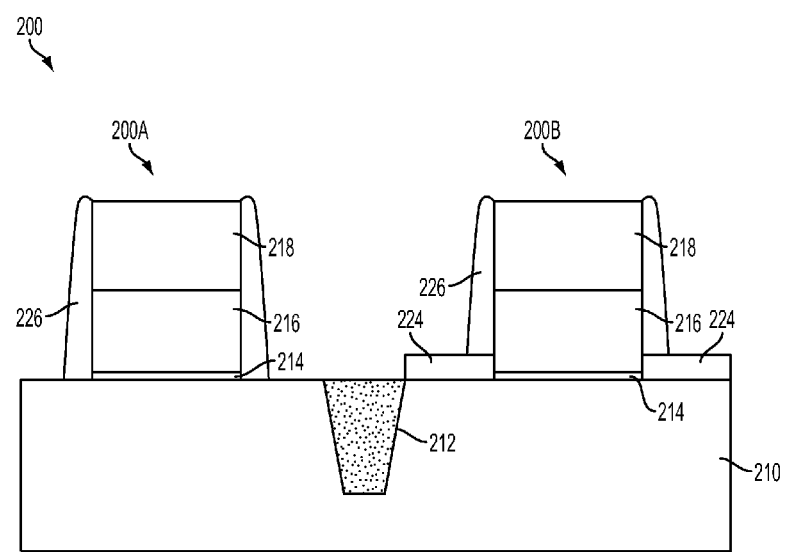

Referring to FIGS. 1 and 7, the method 100 proceeds to step 110 in which the first protective layer 220 over the PMOS device 200A is removed by an etching process. In the depicted embodiment, the etching process is a three-step process. The three-step process, for example, comprises a first step referred to as a passivating step, a second step referred to as a stripping step, and a third step referred to as a cleaning step. In some embodiments, the three-step process is performed in the equipment designed for single-wafer processing. In alternative embodiments, the three-step process is performed in equipment used for bench-type processes. The three-step process may be performed in three separated tanks/chambers or performed within a single tank/chamber.

The first step of the etching process for removing the first protective layer 220 over the PMOS device 200A, in some embodiments, is performed using a chemical to form a passivation layer (not shown) over the isolation feature 212 and/or the hard mask 218 in the NMOS device 200B. In some embodiments, the chemical trends to react with hydroxyl groups on the surface of oxide-based materials, such as the isolation feature 212 and/or the hard mask 218 in the NMOS device 200B, therefore to form the passivation layer. In the depicted embodiment, the chemical comprises hexamethyldisilazane (HMDS), trimethylsilyl chloride (TMSC), or the like. In the depicted embodiment, the chemical is introduced in the processing tank/chamber for a period of time ranging from about 30 seconds to about 120 seconds. In some embodiments, a portion of the chemical is left (or absorbed) on the surfaces of oxide-based materials to form the passivation layer thereon. In some embodiments, the passivation layer has a thickness ranging from about 5 Angstroms and about 50 Angstroms. The passivation layer may prevent the isolation feature 212 and/or the hard mask 218 from being damaged in a subsequent stripping process. In some embodiments, the first step process is performed at a temperature ranging from about 23° C. to about 80° C.

The second step of an etching process is subsequently carried out. In some embodiments, the second step of the etching process is performed using a chemical comprising hydrofluoric acid (HF). In some embodiments, a diluted hydrofluoric acid (DHF) vapor is applied to the surface of substrate 210. In some embodiments, the DHF vapor comprises a HF vapor and a carrier gas (e.g., $N_2$). In the depicted embodiment, the concentration of HF vapor in the DHF vapor ranges between about 30% and about 50%. In some embodiments, the second step process is performed at a temperature less than about 100° C. In the depicted embodiment, the second step process is performed at a temperature ranging from about 23° C. to about 80° C. The second step process may last for a period of time ranging from about 30 seconds to about 120 seconds. In some embodiments, the DHF vapor further comprises isopropyl alcohol (IPA) with a designed concentration (e.g., less than about 10 wt %) to change the absorbability of DHF vapor on the surface of substrate 210, therefore, to change the etching rate of the DHF vapor. In alternative embodiments, the DHF vapor is replaced by a DHF solution for the second step of etching process. The DHF solution, for example, is prepared by mixing a liquid HF with de-ionized water (DIW).

In embodiments, the DHF vapor/solution used in the second step provides a high etching rate to the first protective layer 220, e.g., greater than about 100 Angstrom/min. In embodiments, the DHF vapor/solution used in the second step has a low etching rate (e.g., less than about 1 Angstrom/min.) to the epi features, such as LDD features 224. Therefore, the DHF vapor/solution may provide a high etching selectivity (e.g., greater than about 100) between the first protective layer 220 and the LDD features 224 in the second step, which can remove the first protective layer 220 without substantially damaging the LDD features 224. In addition, the isolation feature 212 and/or the hard mask 218 is not substantially removed in the second step of etching process because of the protection of the passivation layer formed in the first step of etching process as mentioned above.

In some embodiments, the third step of etching process is provided for removing particles resulted in the prior two steps of etching process after removing the first protective layer 220 over the PMOS device 200A. In some embodiments, the third step is performed using a chemical comprising ammonia-peroxide mixture (APM) with a designed concentration, e.g., $NH_4OH:H_2O_2:H_2O=1:1:50$. In some embodiments, the third step is performed at a temperature ranging from about 23° C. to about 60° C. and lasting for a period of time from about 30 seconds to about 120 seconds.

Still referring to FIG. 7, the method 100 proceeds to step 112 in which spacers 226 are formed adjoining sidewalls of the gate structures of the PMOS device 200A and the NMOS device 200B. In some embodiments, spacers 226 are formed over at least a portion of the LDD features 224 adjacent to the sidewalls of the gate structures of the NMOS device 200B. In the depicted embodiment, spacers 226 may be formed by blanket depositing a dielectric spacer layer (not shown), such as a silicon nitride layer, over the PMOS device 200A and the NMOS device 200B, and then the dielectric layer is anisotropically etched to form the spacers 226. Alternatively, liners (not shown) may be included under the spacers 226 by forming a dielectric liner layer, e.g., a silicon oxide layer, under the spacer layer, and then the spacer layer and the liner layer are etched in sequence to form the spacers 226 and the underlying liners. In still another embodiment, the spacers 226 may include other dielectric materials, such as silicon oxide, silicon oxynitride, or combinations thereof.

Figure 8:
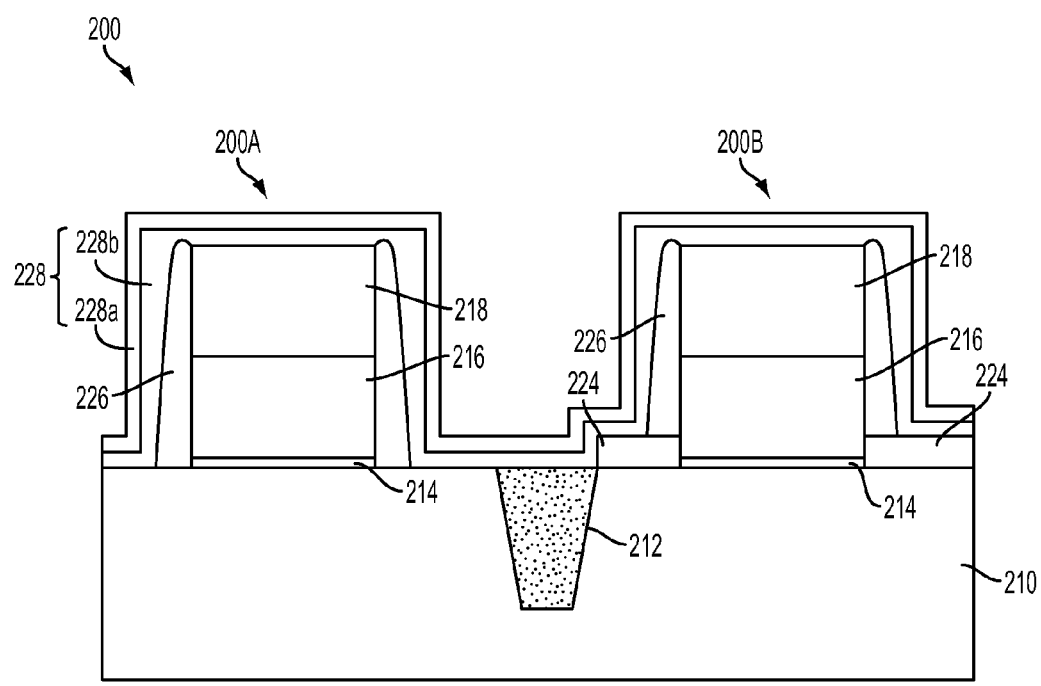
Figure 9:
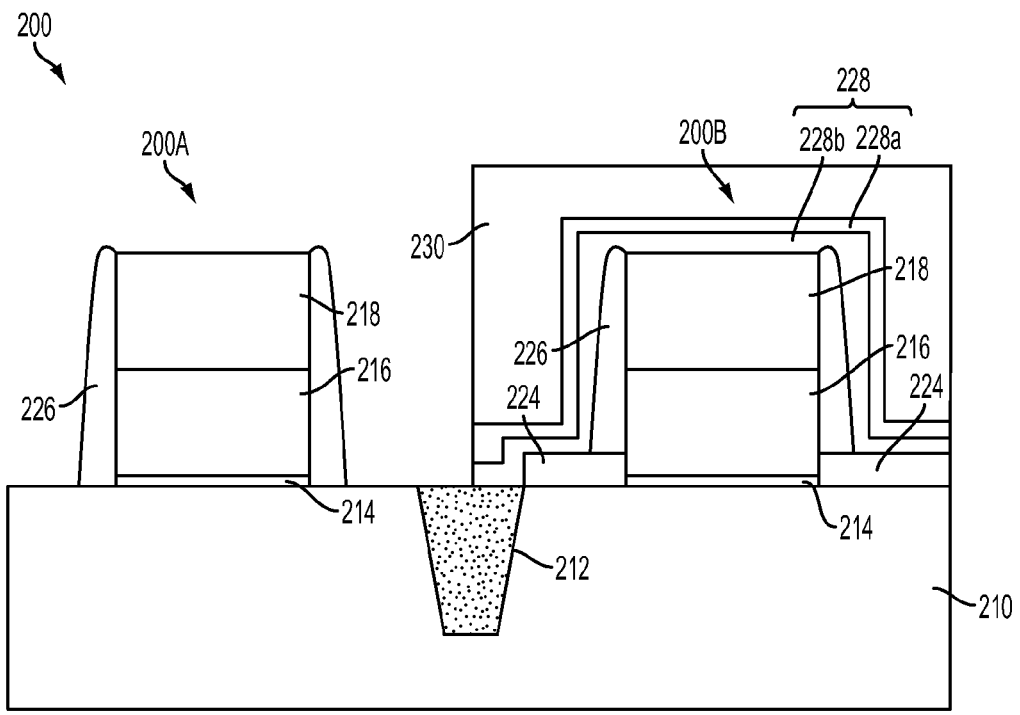

Referring to FIGS. 1, 8, and 9, the method 100 proceeds to step 114 in which a second protective layer 228 is formed over the NMOS device 200B. Referring to FIG. 8, the second protective layer 228 is formed over the substrate 210, the gate structures of the PMOS device 200A and the NMOS 200B. The second protective layer 228 may comprise a top protective layer 228a and a bottom protective layer 228b. The top protective layer 228a and the bottom protective layer 228b may have functions the same as the top protective layer 220a and the bottom protective layer 220b as mentioned above. In some embodiments, the top protective layer 228a and the bottom protective layer 228b are formed by processes the same as the processes for forming the top protective layer 220a and the bottom protective layer 220b as mentioned above.

Referring to FIG. 9, the portion of the second protective layer 228 which is over the PMOS device 200A is removed by a removing process to expose the underlying substrate 210 around the gate structure of PMOS device 200A. The removing process, for example, is an etching process. In some embodiments, the etching process is a two-step dry etching process, including a first step for removing the portion of the top protective layer 228a and a second step for removing the underlying bottom protective layer 228b. The first and second etching steps may be the same as the process for removing the portion of the first protective layer 220 over the NMOS device 200B as mentioned above. Another portion of the second protective layer 228 over the NMOS device 200B is not removed in the etching process because of being covered by a protector 230. The protector 230, for example, is a photoresist pattern. In some embodiments, the protector 230 is removed by a stripping process after removing the second protective layer 228 over the PMOS device 200A.

Figure 10:
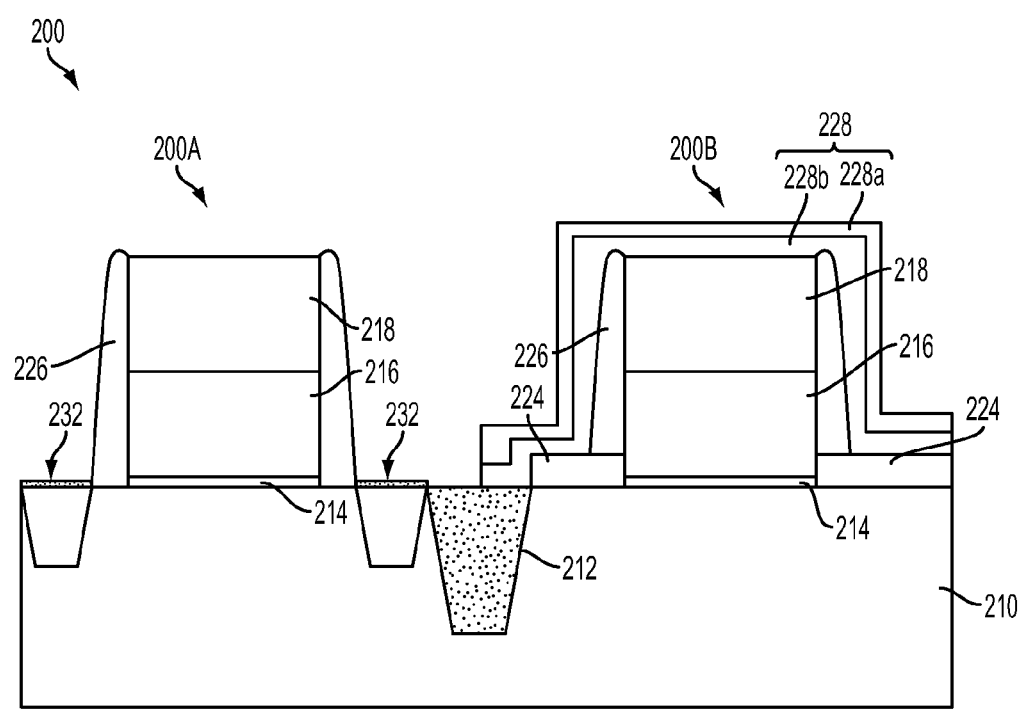
Figure 11:
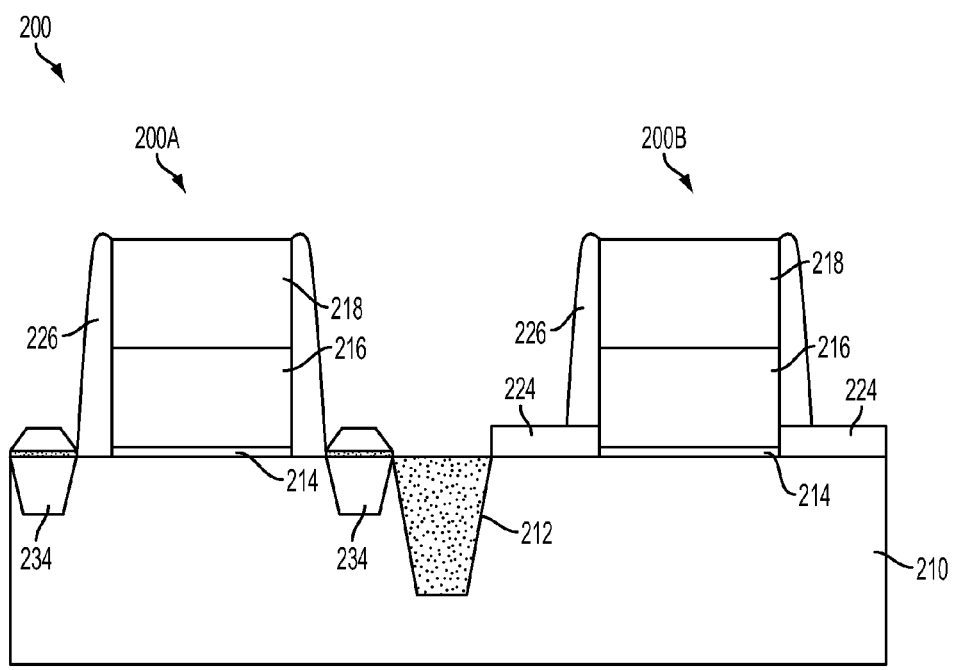

Referring to FIGS. 1, 10, and 11, the method 100 proceeds to step 116 in which source/drain engineering is performed to configure the source/drain regions of the PMOS device region 200A. In FIG. 10, the exposed portions of the substrate 210, particularly in the source and drain regions of the PMOS device 200A, are then removed by an etching process to form recesses 232 in the substrate 210. In some embodiments, the etching process includes a dry etching process, wet etching process, or combination thereof. In the depicted embodiment, the etching process utilizes a combination of dry and wet etching processes. The dry etching process, for example, includes an etching gas of $NF_3$, $Cl_2$, $SF_6$, He, Ar, $CF_4$, or combinations thereof. The wet etching solution may include $NH_4OH$, HF, TMAH (tetramethylammonium hydroxide), other suitable wet etching solutions, or combinations thereof. After the etching process, a pre-cleaning process may be performed to clean the recesses 232 with a HF solution or other suitable solution.

In FIG. 11, a semiconductor material is formed in the recesses 232 to form source and drain features (S/D) (strained structures) 234 of the PMOS device 200A. The source and drain features 234 may alternatively be referred to as raised source and drain regions. In the depicted embodiment, an epi process is provided to form the semiconductor material in the recesses 232. In some embodiments, the source and drain features 234 are formed from a material different from the substrate 210. Accordingly, the channel region of the PMOS device 200A is strained or stressed to enable carrier mobility of the device and enhance device performance. In the depicted embodiment, silicon germanium (SiGe) is formed in the recesses 232 by an epi process to form SiGe source and drain features 234 in a crystalline state on the silicon substrate 210. The SiGe source and drain features 234 may alternatively be referred to as raised source and drain regions. The source and drain features 234 associated with the gate structure of the PMOS device 200A may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 234 may further be exposed to annealing processes, such as a rapid thermal annealing process.

Still referring to FIGS. 1 and 11, the method 100 proceeds to step 118 in which the portion of the second protective layer 228 over the NMOS device 200B is thereafter removed by an etching process. In the depicted embodiment, the etching process is a three-step process. The three-step process, for example, comprises a first step referred to as a passivating step, a second step referred to as a stripping step, and a third step referred to as a cleaning step. The three-step process may be performed in the equipment for single-wafer processes, or alternatively can be performed in the equipment for bench-type processes. The three-step process may be performed in three separated tanks/chambers, or alternatively can be performed within one tank/chamber.

The three-step process for removing the second protective layer 228 over the NMOS device 200B may be the same as the three-step process for removing the first protective layer 220 over the PMOS device 200A as mentioned above. For example, the first step of etching process may form a passivation layer (not shown) over the isolation feature 212 and/or the hard mask 218 in the PMOS device 200A to prevent them from being damaged in a subsequent stripping process. For example, the second step of etching process removes the portion of the second protective layer 228 over the NMOS device 200B using a DHF vapor or DHF solution. In the depicted embodiment, the DHF vapor or DHF solution has a low etching rate to the epi features, such as the source and drain features 234. Therefore, the DHF vapor or DHF solution may provide a high etching selectivity between the second protective layer 228 and the source and drain features 234 (e.g., greater than about 100). In addition, the DHF vapor or DHF solution may remove the second protective layer 228 without substantially attacking the isolation feature 212 and/or the hard mask 218 in the PMOS device 200A because of the protection of the passivation layer formed in the first step of the etching process as mentioned above. After the portion of the first protective layer 220 over the NMOS device 200B has been removed, the third step of etching process is provided for cleaning the semiconductor device 200.

Figure 12:
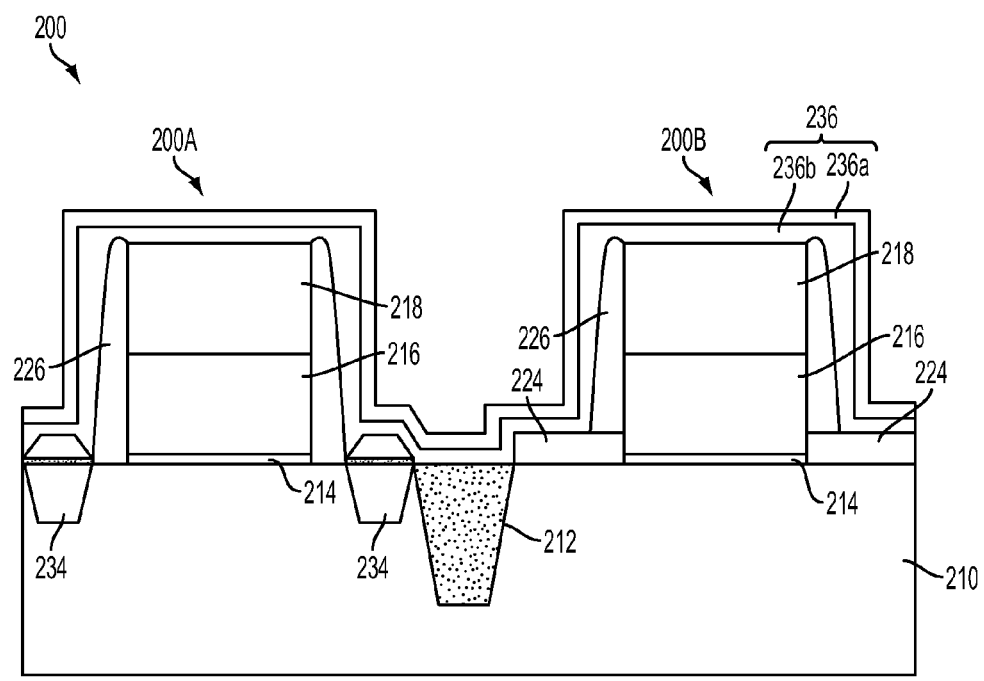
Figure 13:
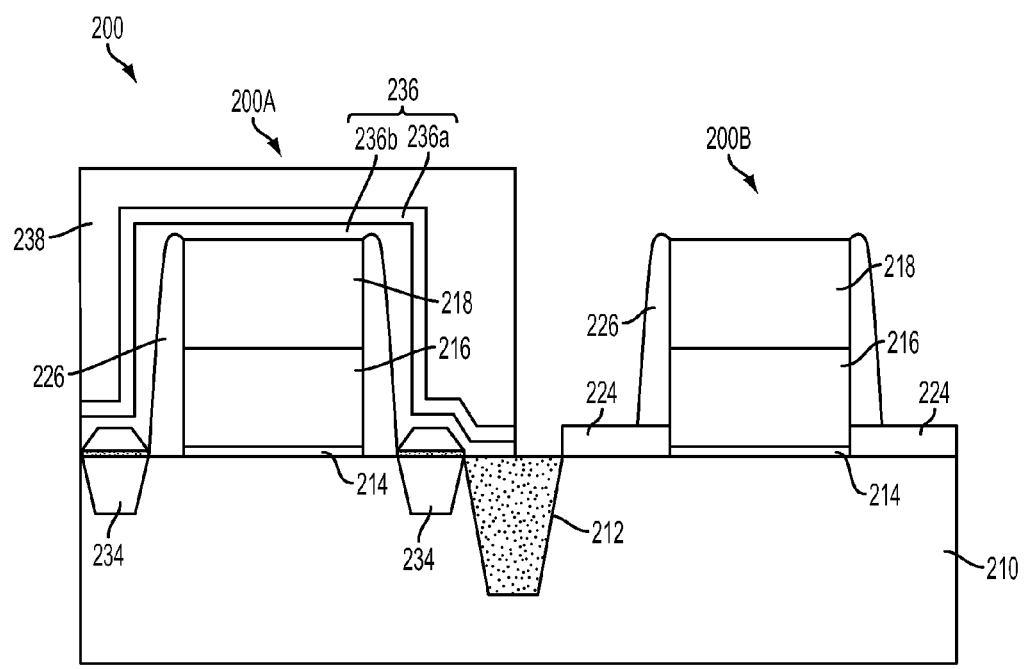

Referring to FIGS. 1, 12, and 13, the method 100 proceeds to step 120 in which a third protective layer 236 is formed over the PMOS device 200A. Referring to FIG. 12, the third protective layer 236 is formed over the substrate 210, the gate structures of the PMOS device 200A and the NMOS device 200B. The third protective layer 236 may comprise a top protective layer 236a and a bottom protective layer 236b. The top protective layer 236a and the bottom protective layer 236b may have functions that are the same as the functions of top protective layer 220a and bottom protective layer 220b as mentioned above. The top protective layer 236a and the bottom protective layer 236b may be provided by the same processes as the processes for forming the top protective layer 220a and the bottom protective layer 220b as mentioned above.

Referring to FIG. 13, the portion of the third protective layer 236 over the NMOS device 200B is removed by a removing process to expose the underlying substrate 210 around the gate structure of NMOS device 200B. The removing process, for example, is an etching process. In some embodiments, the etching process is a two-step dry etching process, including a first step for removing the portion of the top protective layer 236a and a second step for removing the underlying portion of the bottom protective layer 236b. The first and second etching steps may be performed by the same process as the process for removing the portion of the first protective layer 220 over the NMOS device 200B as mentioned above. Another portion of the third protective layer 236 over the PMOS device 200A is not removed in the etching process because of being covered by a protector 238. The protector 238, for example, is a photoresist pattern. In some embodiments, the protector 238 is thereafter removed by a stripping process.

Figure 14:
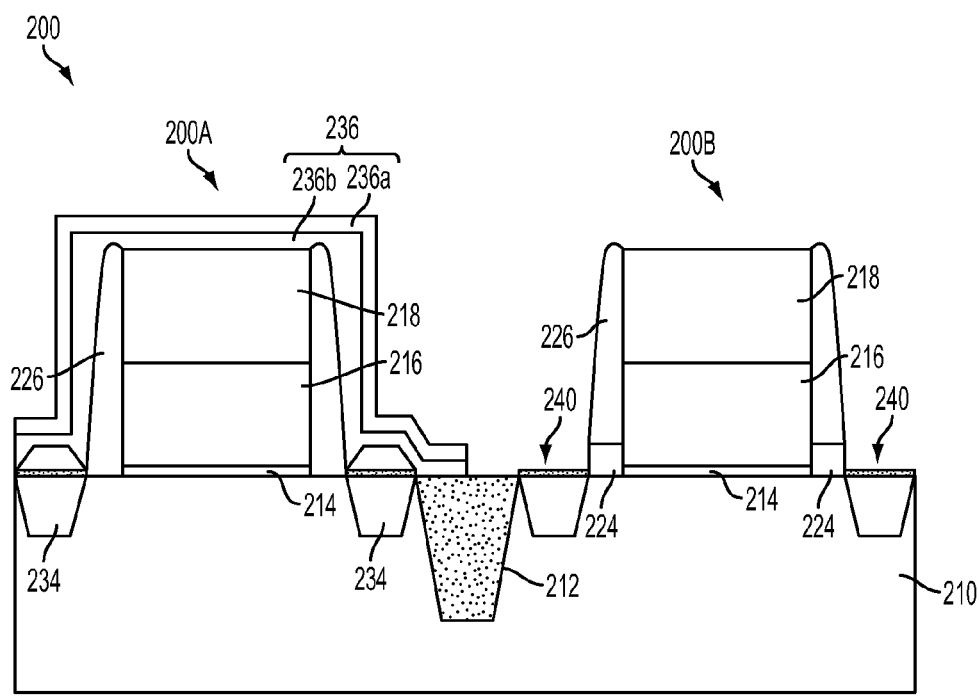
Figure 15:
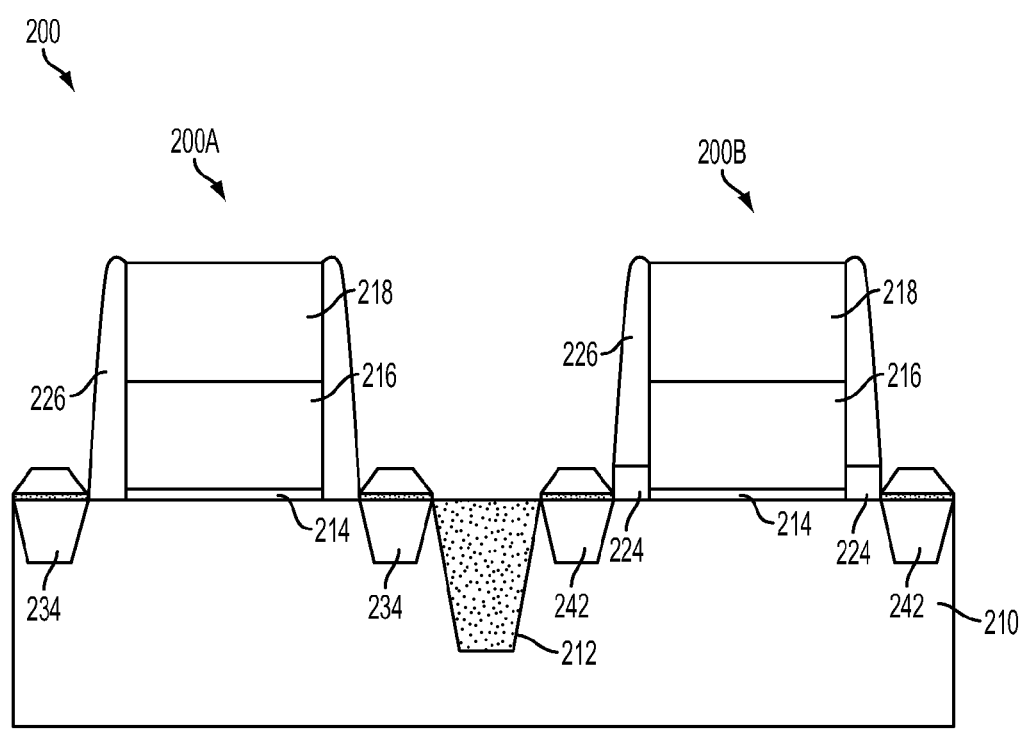

Referring to FIGS. 1, 14, and 15, the method 100 proceeds to step 122 in which source/drain engineering is performed to configure the source/drain regions of the NMOS device region 200B. In FIG. 14, the exposed portions of the substrate 210, particularly in the source and drain regions of the NMOS device 200B, are then removed by an etching process to form recesses 240 in the substrate 210. In some embodiments, the etching process includes a dry etching process, wet etching process, or combination thereof. In the depicted embodiment, the etching process utilizes a combination of dry and wet etching processes. The dry etching process, for example, includes an etching gas of $NF_3$, $Cl_2$, $SF_6$, He, Ar, $CF_4$, or combinations thereof. The wet etching solution may include $NH_4OH$, HF, TMAH (tetramethylammonium hydroxide), other suitable wet etching solutions, or combinations thereof. After the etching process, a pre-cleaning process may be performed to clean the recesses 240 with a HF solution or other suitable solution.

In FIG. 15, a semiconductor material is formed in the recesses 240 to form source and drain features (strained structures) 242 of the NMOS device 200B. In the depicted embodiment, the source and drain features 242 include epitaxially grown silicon (epi Si). The epi Si source and drain features 242 associated with the gate structure of the NMOS device 200B may be in-situ doped or undoped during the epi process. For example, the epi Si source and drain features 242 may be doped with phosphorous to form Si:P source and drain features or doped with carbon to form Si:C source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 242 may alternatively be referred to as raised source and drain regions. The source and drain features 242 may further be exposed to annealing processes, such as a rapid thermal annealing process.

Still referring to FIGS. 1 and 15, the method 100 proceeds to step 124 in which the portion of the third protective layer 236 over the PMOS device 200A is removed by an etching process. In the depicted embodiment, the etching process is a three-step process. The three-step process, for example, comprises a first step referred to as a passivating step, a second step referred to as a stripping step, and a third step referred to as a cleaning step. The three-step process may be performed by a single-wafer process or a bench-type process. The three-step process may be performed in three separated tanks/chambers or performed in one tank/chamber.

The three-step process for removing the third protective layer 236 over the PMOS device 200A may be the same as the three-step process for removing the first protective layer 220 over the PMOS device 200A as mentioned above. For example, the first step of etching process may form a passivation layer (not shown) over the isolation feature 212 and/or the hard mask 218 in the NMOS device 200B to prevent them from being damaged in a subsequent stripping step. For example, the second step of etching process removes the portion of the third protective layer 236 over the PMOS device 200A using a vapor or DHF solution. The vapor or DHF solution has a low etching rate to the epi features, such as the source and drain features 242. Therefore, the vapor or DHF solution may remove the third protective layer 236 without substantially attacking the source and drain features 242. In addition, the isolation feature 212 and/or the hard mask 218 in the NMOS device 200B are not substantially removed by covering the passivation layer formed in the first step. As mentioned above, the third step of etching process may be thereafter provide for cleaning the semiconductor device 200.

Subsequent processing may implement a gate replacement process. For example, metal gates may replace the gate electrode (i.e., polysilicon gate layer) of the gate structures of the PMOS/NMOS devices. A first metal gate having a first work function may be formed in the gate structure of the NMOS devices and a second gate structure having a second work function may be formed in the gate structure of the PMOS devices. The metal gates may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The various embodiments of the present disclosure discussed above offer advantage over other methods known to the inventors, it being understood that no particular advantage is required for all embodiments, and that different embodiments may offer different advantages. One of the advantages is that the defects or particles resulted from the etching process for removing the protective layers may be improved (reduced). Another advantage is that the etching selectivity between the protective layer and epi features may be enhanced, therefore, the etching process may remove the protective layer without substantially attacking the epi features. Therefore, loss of epi features can be controlled. Another advantage is that the hard mask of the gate structure and STI can be protected by a passivation layer, therefore preventing damage in the etching process for removing the protective layer.

One form of the present disclosure involves a method of fabricating an integrated circuit device. The method includes: providing a substrate having a first region and a second region; forming a first gate structure in the first region and a second gate structure in the second region; forming a protective layer over the first gate structure; forming features adjacent to opposite portions of the second gate structure by an epitaxial (epi) growth process; and removing the protective layer, wherein the step of removing comprises: forming a protector over the second gate structure; and performing an etching process using a chemical comprising hydrofluoric acid (HF).

Another form of the present disclosure involves a method of fabricating a CMOS device. The method includes: providing a semiconductor substrate with a shallow trench isolation (STI) feature; forming a first gate structure and a second gate structure overlying the semiconductor substrate and separated by the STI feature; forming spacers adjoining opposite sidewalls of the first and the second gate structures; forming a protective layer overlying the first and the second gate structures; removing a portion of the protective layer over the second gate structure, but leaving another portion of the protective layer over the first gate structure; forming epi features in the semiconductor substrate adjacent to edges of the opposite spacers of the second gate structure; thereafter introducing a chemical to react with surface of the STI feature; and thereafter removing the portion of the protective layer over the first gate structure.

Another form of the present disclosure involves a method of fabricating a CMOS device. The method includes: providing a semiconductor substrate with an isolation feature therein; forming a first and a second gate structures over the semiconductor substrate; forming raised features on the semiconductor substrate at either side of the second gate structure; forming spacers adjoining sidewalls of the first and second gate structures and over at least a portion of the raised features; forming a protective layer over the first and the second gate structures; removing a portion of the protective layer over the first gate structure, but leaving another portion of the protective layer over the second gate structure; forming recesses in the semiconductor substrate at either side of the first gate structure; epitaxially (epi) growing a semiconductor material to fill the recesses; forming protectors over the first gate structure and the isolation feature; removing the portion of the protective layer over the second gate structure using a chemical comprising hydrofluoric acid (HF); and performing a cleaning process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a CMOS device, the method comprising:
   providing a semiconductor substrate with a shallow trench isolation (STI) feature;
   forming a first gate structure and a second gate structure overlying the semiconductor substrate and separated by the STI feature;
   forming spacers adjoining opposite sidewalls of the first and the second gate structures;
   forming a protective layer overlying the first and the second gate structures;
   removing a portion of the protective layer over the second gate structure, but leaving another portion of the protective layer over the first gate structure;
   forming epi features in the semiconductor substrate adjacent to edges of the opposite spacers of the second gate structure;
   thereafter introducing a chemical to react with surface of the STI feature; and
   thereafter removing the portion of the protective layer over the first gate structure.

2. The method of claim 1, wherein the protective layer is silicon nitride.

3. The method of claim 1, wherein the step of removing the portion of the protective layer over the first gate structure comprises using a diluted hydrofluoric acid (DHF) vapor or solution with a concentration ranging between about 30% and about 50%.

4. The method of claim 1, wherein the step of removing the protective layer over the first gate structure is performed at a temperature ranging from about 23° C. to about 80° C.

5. The method of claim 1, wherein the step of removing the portion of the protective layer over the first gate structure comprises using a diluted hydrofluoric acid (DHF) vapor or solution with isopropyl alcohol (IPA).

6. A method of manufacturing a CMOS device, the method comprising:
   forming a plurality of gate structures overlying a semiconductor substrate with a shallow trench isolation (STI) feature, each gate structure of the plurality of gate structures separated from another gate structure of the plurality of gate structures by the STI feature;
   forming spacers adjoining opposite sidewalls of each gate structure of the plurality of gate structures;
   forming a protective layer overlying the each gate structure of the plurality of gate structures;
   removing a portion of the protective layer over at least one gate structure of the plurality of gate structures, but leaving another portion of the protective layer over another gate structure of the plurality of gate structures;
   forming epi features in the semiconductor substrate adjacent to edges of the at least one gate structure;
   thereafter introducing a chemical to react with surface of the STI feature; and
   thereafter removing the another portion of the protective layer.

7. The method of claim 6, wherein removing the portion of the protective layer is performed at a temperature less than about 100° C.

* * * * *